United States Patent
Koda et al.

(10) Patent No.: US 11,793,077 B2
(45) Date of Patent: Oct. 17, 2023

(54) SILICIDE ALLOY MATERIAL AND THERMOELECTRIC CONVERSION DEVICE IN WHICH SAME IS USED

(71) Applicant: TOSOH CORPORATION, Shunan (JP)

(72) Inventors: Yoichiro Koda, Ayase (JP); Ryo Akiike, Ayase (JP); Hideto Kuramochi, Ayase (JP)

(73) Assignee: TOSOH CORPORATION, Shunan (JP)

( * ) Notice: Subject to any disclaimer, the term of this patent is extended or adjusted under 35 U.S.C. 154(b) by 175 days.

(21) Appl. No.: 17/422,953

(22) PCT Filed: Jan. 15, 2020

(86) PCT No.: PCT/JP2020/001073
§ 371 (c)(1),
(2) Date: Jul. 14, 2021

(87) PCT Pub. No.: WO2020/149304
PCT Pub. Date: Jul. 23, 2020

(65) Prior Publication Data
US 2022/0149258 A1 May 12, 2022

(30) Foreign Application Priority Data

Jan. 18, 2019 (JP) .................. 2019-006659
Mar. 7, 2019 (JP) .................. 2019-041217
Aug. 8, 2019 (JP) .................. 2019-146704
Dec. 17, 2019 (JP) .................. 2019-227426

(51) Int. Cl.
C22C 28/00 (2006.01)
H10N 10/855 (2023.01)
C22C 1/04 (2023.01)
B22F 3/14 (2006.01)

(52) U.S. Cl.
CPC ............ *H10N 10/855* (2023.02); *C22C 1/04* (2013.01); *C22C 28/00* (2013.01); *B22F 3/14* (2013.01); *B22F 2201/02* (2013.01); *B22F 2201/11* (2013.01)

(58) Field of Classification Search
CPC .. C22C 28/00; C22C 5/04; C22C 1/04; H10N 10/855
See application file for complete search history.

(56) References Cited

U.S. PATENT DOCUMENTS

2017/0077375 A1  3/2017  Moon et al.
2018/0083178 A1  3/2018  Moon et al.

FOREIGN PATENT DOCUMENTS

JP  2002-368291 A  12/2002
JP  2008-147261 A   6/2008
JP  2019-218592 A  12/2019

OTHER PUBLICATIONS

International Search Report dated Mar. 31, 2020 in PCT/JP2020/001073, 3 pages.
B.A. Simkin, et al., "Directional thermoelectric properties of Ru2Si3", Intermetallics, vol. 13, (2005), pp. 1225-1232.
L. Ivanenko, et al., "Transport properties of Mn-doped Ru2Si3", Microelectronic Engineering, vol. 70, (2003), pp. 209-214.
H. Hohl, et al., "Transport properties of RuSi, RuGe, OsSi, and quasi-binary alloys of these compounds", Journal of Alloys and Compounds, vol. 278, (1998), pp. 39-43.
L. Ivanenko, et al., "Thermoelectric properties of Mn-doped Ru2Si3", $22^{nd}$ International Conference on Thermoelectrics, (2003), pp. 157-160.
B. Buschinger, et al., "Preparation and low temperature properties of FeSi-type RuSi", Journal of Alloys and Compounds, vol. 256, (1997), pp. 57-60.
English translation of International Preliminary Report on Patentability and Written Opinion dated Jun. 16, 2021 in PCT/JP2020/001073, 8 pages.

*Primary Examiner* — Jessee R Roe
(74) *Attorney, Agent, or Firm* — Oblon, McClelland, Maier & Neustadt, L.L.P.

(57) ABSTRACT

Provided is a silicide-based alloy material with which environmental load can be reduced and high thermoelectric conversion performance can be obtained.
Provided is a silicide-based alloy material including silicon and ruthenium as main components, in which when the contents of silicon and ruthenium are denoted by Si and Ru, respectively, the atomic ratio of the devices constituting the alloy material satisfies the following:

$$45 \text{ atm \%} \leq Si/(Ru+Si) \leq 70 \text{ atm \%}$$

$$30 \text{ atm \%} \leq Ru/(Ru+Si) \leq 55 \text{ atm \%}.$$

10 Claims, No Drawings

SILICIDE ALLOY MATERIAL AND THERMOELECTRIC CONVERSION DEVICE IN WHICH SAME IS USED

CROSS-REFERENCE TO RELATED APPLICATIONS

The present application is a 35 U.S.C. § 371 national stage patent application of International patent application PCT/JP2020/001073, filed on Jan. 15, 2020, which is based on and claims the benefits of priority to Japanese Application No. 2019-006659, filed on Jan. 18, 2019, Japanese Application No. 2019-041217, filed Mar. 7, 2019, Japanese Application No. 2019-146704, Aug. 8, 2019, and Japanese Application No. 2019-227426, filed Dec. 17, 2019. The entire contents of all of the above applications are incorporated herein by reference.

TECHNICAL FIELD

The present invention relates to a silicide-based alloy material and a device that uses the same.

BACKGROUND ART

Thermoelectric power generation utilizing exhaust heat has long been known as a candidate for renewable energy. Currently, with regard to exhaust heat at 200° C. or lower, $Bi_2Te_3$ has been put to practical use; however, Bi—Te-based materials have a problem that Bi and Te are both expensive, and Te is extremely highly toxic. Accordingly, there is a demand for thermoelectric conversion devices that can lower power generation costs and reduce environmental load.

Furthermore, exhaust heat generated in garbage incinerators and automobiles are in a temperature range of about 200° C. to 600° C. (hereinafter, referred to as medium temperature range), which exceeds the above-mentioned temperature. Since the materials used in these temperature ranges include highly toxic devices such as Sb and As, the materials have high environmental load.

Attention has been paid to alloy materials obtained by combining metals and silicon, as high-performance thermoelectric materials for a medium temperature range, which have low environmental load. Particularly, $Mg_2Si$ and the like are known (see Patent Literature 1), and a mixture of $Mg_2Si$ and CaMgSi has been proposed as a p-type thermoelectric material that uses homologous devices (see, for example, Patent Literature 2); however, the Seebeck coefficient at 400° C. is as small as 70 µV/K or less, and hence thermoelectrical characteristics that can withstand practical use have not been obtained.

Therefore, there is a demand for a thermoelectric conversion material which has low environmental load and requires low cost, and with which high thermoelectric conversion efficiency is obtained in a temperature range including a temperature range exceeding 200° C.

In Non Patent Literatures 1 and 2, alloys of silicon and ruthenium having high electrical conductivity and high Seebeck coefficient in a medium temperature range are reported; however, these literatures are disclosures related to single crystal samples produced by an FZ method, the thermal conductivity at room temperature is 5.0 W/K·m, and the values of performance index Z, which is an indicator of performance in thermoelectric conversion, and the absolute temperature T remain as low numbers.

Furthermore, it is shown in Non Patent Literature 3 that ruthenium and silicon exhibit relatively high thermoelectric conversion efficiency in a medium temperature range (400° C. to 600° C.). However, in a low temperature range of 200° C. or lower, increase in the electrical conductivity and increase in the Seebeck coefficient cannot be achieved simultaneously, and high thermoelectric conversion efficiency cannot be achieved. In Non Patent Literature 3, an alloy in which the ratio of ruthenium and silicon is adjusted to 1:1 is produced by arc melting, and the electrical characteristics and thermophysical properties are measured; however, the measurement is limited to a temperature region of 300 K or lower, and also for the alloy thus obtained, no detailed information on the textural structure other than the crystal phase is described.

Furthermore, in Non Patent Literature 4, an alloy in which the ratio of ruthenium and silicon is adjusted to a ratio of 1:1 by a method similar to that of Non Patent Literature 3 is produced, and the thermoelectric performance of the alloy is measured; however, it is disclosed that the Seebeck coefficient near 100° C. is 250 µV/K, while the electrical conductivity is about 6×10E-3 Ω·cm. However, also for alloys obtained in the same manner as in Non Patent Literature 4, no detailed information on the textural structure other than the crystal phase is described.

Here, T represents the absolute temperature, and the performance index Z is defined by the following formula.

$$Z = \frac{S^2 \sigma}{\kappa} \qquad \text{[Mathematical Formula 1]}$$

S represents the Seebeck coefficient (V/K), and σ represents electrical conductivity and is a reciprocal of electrical resistance (Ω·m). Furthermore, κ represents thermal conductivity (W/K·m). Furthermore, the numerator portion of Z (the product of the square of S and σ) is referred to as power factor (W/K²·m).

Furthermore, (power factor/thermal conductivity)×temperature (K: kelvin) is referred to as thermoelectric conversion performance.

The inventors of the present invention found that when a silicide-based alloy material containing silicon and ruthenium as main components, the alloy material having a controlled crystal grain size and containing a plurality of crystal phases, is used, thermal conductivity can be suppressed, and thermoelectric performance can be enhanced.

CITATION LIST

Patent Literature

Patent Literature 1: Japanese Unexamined Patent Publication No. 2002-368291
Patent Literature 2: Japanese Unexamined Patent Publication No. 2008-147261

Non Patent Literature

Non Patent Literature 1: L. Ivanenko et al. 22$^{nd}$ International Conference on Thermoelectrics 2003 157-160
Non Patent Literature 2: L. Ivanenko et al. Microelectronic Engineering 70(2003) 209-214

Non Patent Literature 3: B. Buschinger et al. Journal of Alloys and Compounds 256(1997) 57-60
Non Patent Literature 4: H. Hole et al. Journal of Alloys and Compounds 278(1998) 39-43.

SUMMARY OF INVENTION

Problem to be Solved by Invention

An object of the present invention is to develop a silicide-based alloy material with which environmental load can be reduced and high thermoelectric conversion performance can be obtained, and a device that uses the silicide-based alloy material.

Means for Solving Problem

That is, the present invention has the following gist.

(1) A silicide-based alloy material comprising silicon and ruthenium as main components, wherein when the contents of silicon and ruthenium are denoted by Si and Ru, respectively, the atomic ratio of devices constituting the alloy material satisfies the following:

$$45 \text{ atm }\% \leq Si/(Ru+Si) \leq 70 \text{ atm }\%$$

$$30 \text{ atm }\% \leq Ru/(Ru+Si) \leq 55 \text{ atm }\%.$$

(2) The silicide-based alloy material according to (1), wherein the average crystal grain size of the silicide-based alloy material is 50 μm or less.

(3) The silicide-based alloy material according to (1) or (2), wherein the average crystal grain size of the silicide-based material is 1 nm to 20 μm.

(4) The silicide-based alloy material according to any one of (1) to (3), wherein the average crystal grain size of the silicide-based alloy material is 3 nm to 1 μm.

(5) The silicide-based alloy material according to any one of (1) to (4), wherein the average crystal grain size of the silicide-based alloy material is 5 nm to 500 nm.

(6) The silicide-based alloy material according to any one of (1) to (5), wherein the silicide-based alloy material is a silicide-based alloy material containing silicon and ruthenium as main components and has a plurality of crystal phases in the texture.

(7) The silicide-based alloy material according to any one of (1) to (6), wherein the contents of silicon and ruthenium satisfy the following:

$$55 \text{ atm }\% \leq Si/(Ru+Si) \leq 65 \text{ atm }\%$$

$$35 \text{ atm }\% \leq Ru/(Ru+Si) \leq 45 \text{ atm }\%$$

(8) The silicide-based alloy material according to any one of (1) to (7), wherein the silicide-based alloy material is a silicide-based alloy material comprising silicon and ruthenium as main components and has at least two or more kinds of crystal phases selected from space groups 198, 64, and 60 in the texture.

(9) The silicide-based alloy material according to any one of (1) to (6), wherein the contents of silicon and ruthenium satisfy the following:

$$47 \text{ atm }\% \leq Si/(Ru+Si) \leq 60 \text{ atm }\%$$

$$40 \text{ atm }\% \leq Ru/(Ru+Si) \leq 53 \text{ atm }\%$$

(10) The silicide-based alloy material according to any one of (1) to (6) and (9), wherein the silicide-based alloy material is a silicide-based alloy material containing silicon and ruthenium as main components and has crystal phases with space groups 221 and 198 in the texture.

(11) A thermoelectric conversion device using the silicide-based alloy material according to any one of (1) to (10).

Effects of Invention

A thermoelectric conversion device having high efficiency in a wide temperature range can be produced by using the silicide-based alloy material of the present invention.

EMBODIMENTS FOR CARRYING OUT INVENTION

The present invention will be described in detail below.

The average crystal grain size of the silicide-based alloy material of the present invention is preferably 50 μm or less, more preferably 1 nm to 50 μm, even more preferably 1 nm to 20 μm, still more preferably 3 nm to 1 μm, even more preferably 5 nm to 500 nm, and most preferably 5 nm to 100 nm.

Furthermore, with regard to the average crystal grain size of the present invention, since most of the reasons why the performance of a thermoelectric conversion device remains low are due to the highness of thermal conductivity, the thermal conductivity can be decreased by suppressing the average crystal grain size to a low level. However, the average crystal grain size suitable for efficiently suppressing thermal conduction varies depending on the type of the material. This is because phonons that transfer heat have different mean free paths depending on the type of the material. In addition, when the average crystal grain size is less than 1 nm, the possibility that electrical conduction may be lowered is high, and therefore, a problem of deteriorating the performance of a thermoelectric conversion device also occurs.

The average crystal grain size as used herein means a value obtained by counting the number of crystal grains having a particular size with respect to the number of crystal grains observed in a particular region and calculating the average value.

[Mathematical Formula 2]

$$\text{Average crystal grain size} = \frac{\sum\limits_{\text{Number of crystal grains observed}} \left\{ \begin{pmatrix} \text{Number of crystals having a} \\ \text{particular grain size} \\ \text{(Grain size of the crystals)} \end{pmatrix} \times \right\}}{\text{Number of measured crystal grains}}$$

Furthermore, due to the characteristics of thermal conductivity, in addition to the average crystal grain size, the value of the area-weighted average crystal grain size also becomes important. The area-weighted average crystal grain size is a value obtained by multiplying the average crystal grain size present in the measurement region by the area occupied by the crystal grain group having the size, and dividing the product by the measurement area, and the value is represented by the following formula.

$$\text{Area-weighted average crystal grain size} = \frac{\sum\limits_{\text{grains observed}}^{\text{Number of crystal}} \left\{ \begin{pmatrix} \text{Area occupied by crystal grain} \\ \text{group having a particular} \\ \text{grain size} \\ \text{(Grain size of the crystals)} \end{pmatrix} \times \right\}}{\text{Area of measured region}}$$ [Mathematical Formula 3]

Furthermore, it is preferable that the ratio between the average crystal grain size and the area-weighted crystal grain size is as small as possible and close to 1. This is because when coarse crystals grains are mixed in the texture of an alloy composed of fine crystal grains, heat transfer occurs via the coarse crystal grains when heat is conducted. Therefore, when the ratio of the average crystal grain size and the area-weighted average crystal grain size is designated as R (=area-weighted average crystal grain size/average crystal grain size), the value of R is preferably 10 or less, and more preferably 5 or less. The value is most preferably 2 or less.

The silicide-based alloy material of the present invention may include very small amounts of unavoidable impurities. Examples of these impurities include metal devices other than Si and Ru, and compounds such as oxides thereof.

The silicide-based alloy material of the present invention is a silicide-based alloy material containing silicon and ruthenium as main components, and when the contents of silicon and ruthenium are denoted by Si and Ru, respectively, the atomic ratio of the devices constituting the alloy material satisfies the following:

45 atm %≤Si/(Ru+Si)≤70 atm %

30 atm %≤Ru/(Ru+Si)≤55 atm %, while from the viewpoint of being preferably suitable as a thermoelectric conversion material (high-temperature thermoelectric material) in a temperature range of 200° C. to 600° C., the atomic ratio preferably satisfies:

55 atm %≤Si/(Ru+Si)≤65 atm %

35 atm %≤Ru/(Ru+Si)≤45 atm %, and particularly preferably 57 atm %≤Si/(Ru+Si)≤63 atm %

37 atm %≤Ru/(Ru+Si)≤42 atm %.

Most preferably, the atomic ratio satisfies:

59 atm %≤Si/(Ru+Si)≤63 atm %

37 atm %≤Ru/(Ru+Si)≤41 atm %.

This is because silicide-based alloy materials of silicon and ruthenium exhibit a semiconductor crystal phase having excellent thermoelectric conversion performance for high-temperature thermoelectric materials in the above-described range, and when the composition is out of this composition range, the silicide-based alloy material shows a crystal phase having metallic physical properties, so that the thermoelectric conversion performance is noticeably deteriorated.

It is preferable that the textural structure of the silicide-based alloy material for a high-temperature thermoelectric material has a plurality of crystal structures having a plurality of different ratios of ruthenium and silicon. Particularly preferably, the textural structure may be a texture containing at least two or more kinds of crystal structures selected from space groups 198, 64, and 60. In addition, in order to achieve high thermoelectric performance in a medium temperature range, it is preferable that the textural structure contains two or more kinds of crystal structures selected from space groups 198 and 60.

With regard to the contents of silicon and ruthenium, from the viewpoint of being preferably suitable as a thermoelectric conversion material (low-temperature thermoelectric material) in a temperature range of 200° C. or lower, preferably the following is satisfied:

47 atm %≤Si/(Ru+Si)≤60 atm %

40 atm %≤Ru/(Ru+Si)≤53 atm %, and particularly preferably the following is satisfied:

48 atm %≤Si/(Ru+Si)≤55 atm %

45 atm %≤Ru/(Ru+Si)≤52 atm %.

Most preferably, the following is satisfied:

48 atm %≤Si/(Ru+Si)≤52 atm %

52 atm %≤Ru/(Ru+Si)≤48 atm %.

This is because a silicide-based alloy material of silicon and ruthenium exhibits a semiconductor crystal phase having excellent thermoelectric conversion performance for a low-temperature thermoelectric material in the above-described range, and when the composition is out of this composition range, the crystal structure of the silicide-based alloy material becomes a metallic crystal phase, so that the thermoelectric conversion performance is noticeably deteriorated.

It is preferable that the textural structure of the silicide-based alloy material for a low-temperature thermoelectric material has a plurality of crystal structures having a plurality of different ratios of ruthenium and silicon. Particularly preferably, the textural structure may be a texture containing crystal structures with space groups 221 and 198. Furthermore, in order to exhibit high thermoelectric conversion performance in a low temperature range near 100° C., it is preferable that the abundance ratio of phase 1 having a crystal structure with space group 221 and phase 2 having a crystal structure with space group 198 (phase 1/(phase 1+phase 2)) satisfies the following:

0.0001≤(phase 1/(phase 1+phase 2))≤0.3.

More preferably, the abundance ratio satisfies the following:

0.0001≤(phase 1/(phase 1+phase 2))≤0.1.

Most preferably, the abundance ratio satisfies the following:

0.0001≤(phase 1/(phase 1+phase 2))≤0.05.

Next, the method for producing a silicide-based alloy material of the present invention will be described.

The production method of the present invention is preferably a production method including a step of synthesizing an alloy from ruthenium and silicon; a step of pulverizing or quenching the alloy as necessary to obtain a powder; and a calcination step of subjecting the alloy powder to a hot press treatment at 900° C. to 1850° C.

First, in the step of synthesizing an alloy from ruthenium and silicon, ruthenium and silicon are prepared at a predetermined ratio and melted in advance in an arc melting furnace, and thereby ruthenium silicide is synthesized. This is for removing impurities in the powder and for making the alloy texture that will be described below even finer. In addition, regarding the melting conditions, it is preferable to treat the alloy with higher power in a short period of time, rather than to melt the alloy with low discharge power for a long period of time. The amount of current is preferably 30 A/g or more, and more preferably 200 A or more, as the current value per unit sample amount. When the current value is 20 A/g or less, the amount of current is insufficient, ruthenium cannot be melted, and as a result, it is difficult to obtain a homogeneous alloy, which is not preferable.

An alloy obtained from the above-described preferred conditions becomes an alloy of ruthenium silicide.

Next, the step of pulverizing the alloy into a powder or quenching the alloy as necessary is a step of making the particle size of the resulting powder smaller.

When pulverizing the alloy, it is preferable that the pulverization operation is carried out in an inert gas atmosphere so as not to increase the amount of incorporated oxygen after the synthesis of the alloy. It is because by doing so, oxidation of the powder surface is prevented, and the amount of incorporated oxygen can be suppressed to a low level. Furthermore, the textural structure when produced into a silicide-based alloy material can be controlled by the method of pulverization. As the method of pulverization and granulation, methods such as pulverization with a mortar, a ball mill, a jet mill, a bead mill, a spray drying, and gas atomization can be utilized. The primary particle size of the powder obtainable at this time is preferably as small as possible. Furthermore, in the case of being granulated, the average granulated particle size of the granulated powder is not particularly limited; however, the average granulated particle size is more preferably about 10 to 100 μm, in view of handleability and the like.

Furthermore, it is possible to individually produce a silicide-based alloy material appropriate as a high-temperature thermoelectric material and a silicide-based alloy material appropriate as a low-temperature thermoelectric material, respectively, based on the composition ratio of the raw materials. The silicide-based alloy material appropriate as a high-temperature thermoelectric material and the silicide-based alloy material appropriate as a low-temperature thermoelectric material can be obtained by mixing the raw material powders so as to obtain the respective composition ratios according to the ratios of Ru and Si described above.

When quenching the alloy, a silicide-based alloy material that has been brought to a molten state is sprayed into a water-cooled copper roller rotating at 3000 rpm to be instantaneously solidified from a molten state, and the alloy material can be produced into a ribbon shape (quenched ribbon). The cooling rate at that time may be about $8 \times 10^5$ K/s in an example.

Finally, in the calcination step of subjecting the alloy powder to a hot press treatment at a calcination temperature of 900° C. to 1850° C., as the sintering method, in addition to an atmosphere-controlled furnace and a hot press, which is a kind of pressure sintering, sintering methods such as electric current activated sintering (ECAS) represented by pulse electric current pressure sintering, and spark plasma sintering can be used, and among them, spark plasma sintering is preferred.

An example of hot press, which is a kind of pressure sintering, will be described below. A hot press method is an apparatus that promotes sintering by applying a temperature while pressurizing a powder and is a calcination method that assists diffusion during calcination by performing uniaxial pressurization during heating, and allows a material which cannot be easily sintered, such as a case in which the diffusion coefficient is low or a case in which the particle size of metal or the like is large, to be sintered. By performing calcination by the hot press method, the density increases compared to conventional cases, and it is possible to obtain a silicide-based alloy material having a relative density of 80% or higher when the theoretical density of $Ru_2Si_3$ is set to 6.79 g/cm$^3$ and the theoretical densities of phase 1 and phase 2 of RuSi are set to 8.44 g/cm$^3$ and 8.04 g/cm$^3$, respectively.

The calcination temperature in the hot press treatment is 900° C. to 1850° C., and calcination is performed preferably at 900° C. to 1800° C. At a temperature lower than 900° C., sintering does not proceed, and the density increases only to the extent that is identical to the molded body density. Furthermore, when calcination is performed at a temperature higher than 1850° C., $Ru_2Si_3$ and RuSi melt, the alloy adheres to the hot press mold, and there is a possibility that the product yield may be deteriorated.

Here, in the case of a silicide-based alloy material appropriate as a high-temperature thermoelectric conversion material, since high thermoelectric conversion performance is likely to be obtained, it is preferable that the calcination temperature is 1600° C. or higher. On the other hand, in the case of a silicide-based alloy material appropriate for low-temperature thermoelectric conversion performance, the calcination temperature is preferably 1600° C. or higher, or 1300° C. or lower, from the viewpoint that the production ratio of phase 2 is easily controllable, and high thermoelectric conversion performance is likely to be obtained.

The pressure during calcination is preferably 10 MPa to 100 MPa. It is because the density of the silicide-based alloy material is increased, and the silicide-based alloy material can be made usable even with carbon molds that are generally used. It is also possible to change the crystal phase produced in the silicide-based alloy material by further controlling the pressing pressure. Particularly, when a silicide-based alloy material appropriate as a high-temperature thermoelectric conversion material is produced, the pressure is particularly preferably 10 MPa to 40 MPa from the viewpoint that thermoelectric conversion performance is easily achieved.

Regarding the atmosphere for sintering, it is preferable that sintering is performed in an inert gas atmosphere that does not include oxygen, such as nitrogen or argon, or in a vacuum.

The retention time at the calcination temperature of the hot press treatment is not particularly limited and is preferably 10 minutes or longer, and when the retention time is short, the material is not heated uniformly to the inner part, and shape retention as a polycrystalline body is difficult. On the other hand, the retention time is preferably 1 hour or less. Prolongation of the retention time causes an increase in the particle size, and as a result, there is a possibility to bring about an increase in thermal conductivity.

The silicide-based alloy material of the present invention may be processed to have predetermined dimensions. The processing method is not particularly limited, and a surface grinding method, a rotary grinding method, a cylindrical grinding method, or the like can be used. By using these methods, the alloy material can be processed into a shape appropriate for a thermoelectric conversion device use application.

It is preferable that the silicide-based alloy material of the present invention is produced into a thermoelectric conversion device.

A thermoelectric conversion device is produced using a p-type semiconductor and an n-type semiconductor. Therefore, it is preferable that the semiconductor materials to be used can be subjected to p-type control and n-type control. In the present invention, p-type control and n-type control can be achieved by adding particular devices to the alloy of silicon and ruthenium.

An example of the method for producing a thermoelectric conversion device using the above-described silicide-based alloy material will be described below.

The respective p-type and n-type silicide-based alloy materials are installed in parallel so as not to come into contact with each other, and the upper part is bridged by electrodes. When these structures are produced into a II-shaped device, the upper part of the device has a structure that comes into contact with high temperature so that when heated, a temperature gradient is generated between the upper part and the lower part of the device, and a current is generated from the potential difference occurring due to the Seebeck effect according to the temperature difference ΔT (=TH−TL) at that time. Therefore, an effect as a battery can be obtained by attaching electrodes to each of the p-type and n-type silicide-based alloy materials in the lower part of the device to form a circuit through an appropriate resistor.

EXAMPLES

Hereinafter, Examples of the present invention will be described; however, the present invention is not intended to be limited to these.

(Method for Measuring Average Crystal Grain Size)

Measurement was made using an electrolytic emission type operation electron microscope JSM-7100F (manufactured by JEOL, Ltd.) with EBSP.

(Method for Measuring Crystal Phase)

Identification of crystal phases was carried out from the diffraction peaks obtained by X-ray diffraction measurement.

(Method for Measuring Composition)

Quantitative determination was carried out by an ICP-MS mass analysis method.

(Method for Measuring Electrical Characteristics)

Measurement was made using a Hall effect analyzer (ResiTest 8400 manufactured by Toyo Corporation).

(Method for Measuring Seebeck Coefficient)

A Seebeck coefficient measurement system (option for ResiTest 8400 manufactured by Toyo Corporation) was attached to the above-described Hall effect analyzer, and measurement was carried out.

(Method for Measuring Thermal Conductivity)

Measurement was carried out using a laser flash method thermal conduction analyzer (LFA-457 manufactured by NETZSCH Group).

Example 1

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=60 atm % and Ru/(Ru+Si)=40 atm %, and then the mixture was filled into a water-cooled mold and was subjected to arc melting. The raw material lump thus obtained was pulverized in an agate mortar using a mortar, and a powder was produced. The obtained powder was filled into a rectangle-shaped hot press mold having a size of 30 mm×15 mm, and hot pressing was performed. The hot press conditions were set to a rate of temperature increase of 200° C./hour, the powder was maintained for 1 hour at a calcination temperature of 1400° C., and the pressure was set to 2.3 ton. Furthermore, the degree of vacuum was 1.0e-2 Pa. During sintering, a REFERTHERMO (type L) installed near the alloy sample showed 1250° C.

As a result of EBSD measurement, regarding the obtained alloy sample, a crystal phase (space group 60) of $Ru_2Si_3$ mixed with about 0.001% of Si phase in terms of area ratio was observed.

Assuming that the alloy sample was pure $Ru_2Si_3$, the relative density of the obtained alloy sample was calculated to be 91.2% by the Archimedes method, using the theoretical density of $Ru_2Si_3$ of 6.79 g/cm$^3$.

Subsequently, the alloy sample was processed into a size of 10 mm×10 mm×1 mm t to obtain a sample for electrical characteristics measurement, the alloy sample was processed into a size of 10 mm×2 mm t to obtain a sample for thermal conductivity measurement, and the respective samples were subjected to measurement. The measurement conditions were set to 600° C. and vacuum conditions for the Seebeck coefficient and electrical resistance. On the other hand, the thermal conductivity was measured under two conditions of room temperature in a nitrogen atmosphere, and 600° C. in an Ar atmosphere. The respective measurement results are shown in Table 1.

Example 2

The hot press conditions were set to a calcination temperature of 1750° C., and for the other conditions, the experiment was carried out under conditions similar to those of Example 1.

Example 3

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=61 atm % and Ru/(Ru+Si)=39 atm %, the hot press conditions were set to a calcination temperature of 1750° C. and a pressing pressure of 1.1 ton, and for the other conditions, the experiment was carried out under conditions similar to those of Example 1.

Example 4

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=61 atm % and Ru/(Ru+Si)=39 atm %, the hot press conditions were set to a calcination temperature of 1750° C. and a pressing pressure of 1.1 ton, and for the other conditions, the experiment was carried out under conditions similar to those of Example 1.

Example 5

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=61 atm % and Ru/(Ru+Si)=39 atm %, the hot press conditions were set to a calcination temperature of 1750° C. and a pressing pressure of 0.5 ton, and for the other conditions, the experiment was carried out under conditions similar to those of Example 1.

Seebeck coefficient and electrical resistance. On the other hand, the thermal conductivity was measured under two conditions of room temperature in a nitrogen atmosphere, and 100° C. in an Ar atmosphere. The respective measurement results are shown in Table 2.

TABLE 1

| | Composition | | Average crystal grain size (m) | Area-weighted average crystal grain size (m) | Space group of observed crystal phase | Electrical resistance (Ω · cm) | Seebeck coefficient (μV/K) | Power factor (W/mK$^2$) | Thermal conductivity (W/K · m) | |
|---|---|---|---|---|---|---|---|---|---|---|
| | Si/(Si + Ru) at % | Ru/(Si + Ru) at % | | | | | | | Room temperature | 600° C. |
| Example 1 | 60 | 40 | 2.10E−06 | 4.10E−06 | 60, 198 | 4.20E−02 | 322 | 2.47E−04 | 4.0 | 1.6 |
| Example 2 | 60 | 40 | 3.00E−06 | 2.70E−05 | 60, 198 | 1.20E−02 | 315 | 8.27E−04 | 4.6 | 2.8 |
| Example 3 | 61 | 39 | 2.20E−06 | 1.02E−05 | 60, 198 | 1.70E−02 | 310 | 5.65E−04 | 4.6 | 3.0 |
| Example 4 | 58.8 | 41.2 | 3.20E−06 | 2.80E−05 | 60, 198 | 5.90E−03 | 144 | 3.51E−04 | 4.9 | 3.1 |
| Example 5 | 60 | 40 | 1.30E−05 | 6.20E−05 | 60 | 4.10E−02 | 350 | 2.99E−04 | 6.0 | 4.1 |

The obtained results of Examples 1 to 5 showed values lower than the thermal conductivity 5 W/K·m described in Non Patent Literatures 1 and 2 even at 600° C. From this, it is possible to achieve high thermoelectric conversion performance even at 600° C. by controlling the textural particle size of the alloy to be finer.

Example 6

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=50 atm % and Ru/(Ru+Si)=50 atm %, and then the mixture was filled into a water-cooled mold and was subjected to arc melting. The raw material lump thus obtained was pulverized in an agate mortar using a mortar, and a powder was produced. The obtained powder was filled into a rectangle-shaped hot press mold having a size of 30 mm×15 mm, and hot pressing was performed. The hot press conditions were set to a rate of temperature increase of 200° C./hour, the powder was maintained for 1 hour at a retention temperature of 1400° C., and the pressure was set to 2.3 ton. Furthermore, the degree of vacuum was 1.0e-2 Pa. During sintering, a REFER-THERMO (type L) installed near the alloy sample showed 1250° C.

As a result of EBSD measurement, it was found that the obtained alloy sample had a textural structure of RuSi in which a crystal phase (phase 1) with space group 221 and a crystal phase (phase 2) with space group 198 were included at proportions resulting in an area ratio (phase 1/(phase 1+phase 2))=0.005.

Regarding the relative density of the obtained alloy sample, assuming that the alloy sample had a true density, which was an arithmetic mean of the respective theoretical densities of phase 1 and phase 2 of RuSi, 8.44 g/cm$^3$ and 8.04 g/cm$^3$, the relative density was calculated to be 95.0% by the Archimedes method.

Subsequently, the alloy sample was processed into a size of 10 mm×10 mm×1 mm t to obtain a sample for electrical characteristics measurement, the alloy sample was processed into a size of 10 mm×2 mm t to obtain a sample for thermal conductivity measurement, and the respective samples were subjected to measurement. The measurement conditions were set to 100° C. and vacuum conditions for the Example 7

The hot press conditions were set to a retention temperature of 1750° C., and for the other conditions, the experiment was carried out under conditions similar to those of Example 6.

Example 8

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=49 atm % and Ru/(Ru+Si)=51 atm %, the hot press conditions were set to a retention temperature of 1750° C. and a pressing pressure of 1.1 ton, and for the other conditions, the experiment was carried out under conditions similar to those of Example 6.

Example 9

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=51 atm % and Ru/(Ru+Si)=49 atm %, the hot press conditions were set to a retention temperature of 1750° C. and a pressing pressure of 1.1 ton, and for the other conditions, the experiment was carried out under conditions similar to those of Example 6.

Example 10

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=50 atm % and Ru/(Ru+Si)=50 atm %, the hot press conditions were set to a retention temperature of 1750° C. and a pressing pressure of 0.5 ton, and for the other conditions, the experiment was carried out under conditions similar to those of Example 6.

TABLE 2

| | Composition | | Average | Area-weighted | Space group of | | Electrical | Seebeck | Power | Thermal conductivity | |
|---|---|---|---|---|---|---|---|---|---|---|---|
| | Si/ | Ru/ | crystal | average | observed | Phase 1/ | | | | (W/K · m) | |
| | (Si + Ru) at % | (Si + Ru) at % | grain size (m) | crystal grain size (m) | crystal phase | (phase 1 + phase 2) | resistance (Ω · cm) | coefficient (μV/K) | factor (W/mK²) | Room temperature | 100° C. |
| Example 6 | 50 | 50 | 2.10E−06 | 4.10E−06 | 198, 221 | 0.002 | 4.10E−03 | 296 | 2.14E−03 | 12.0 | 10.0 |
| Example 7 | 50 | 50 | 3.00E−06 | 2.70E−05 | 198, 221 | 0.001 | 4.40E−03 | 304 | 2.10E−03 | 11.5 | 11.0 |
| Example 8 | 49 | 51 | 2.20E−06 | 1.02E−05 | 198, 221 | 0.003 | 3.90E−03 | 315 | 2.54E−03 | 11.0 | 9.0 |
| Example 9 | 51 | 49 | 3.20E−06 | 2.80E−05 | 198, 221 | 0.01 | 5.60E−03 | 285 | 1.45E−03 | 13.0 | 11.0 |
| Example 10 | 50 | 50 | 1.30E−05 | 6.20E−05 | 198, 221 | 0005 | 4.10E−03 | 301 | 2.21E−03 | 12.0 | 10.0 |

Example 11

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=50 atm % and Ru/(Ru+Si)=50 atm %, the mixture was melted in an arc melting furnace at an input current of 30 A/g to produce an ingot, and then the ingot was pulverized with an agate mortar to obtain a powder. The powder was passed through a 300 μm-mesh sieve and then was used as a hot press raw material. The hot press conditions were set to a retention temperature of 1750° C. and a pressing pressure of 3.5 ton, and for the other conditions, the experiment was carried out under conditions similar to those of Example 6.

Example 12

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=50 atm % and Ru/(Ru+Si)=50 atm %, the mixture was melted in an arc melting furnace at an input current of 30 A/g to produce an ingot, and then the ingot was pulverized with an agate mortar to obtain a powder. The powder was passed through a 300 μm-mesh sieve and then was used as a hot press raw material. The hot press conditions were set to a retention temperature of 1200° C. and a pressing pressure of 3.5 ton, and for the other conditions, the experiment was carried out under conditions similar to those of Example 6.

Example 13

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=50 atm % and Ru/(Ru+Si)=50 atm %, the mixture was melted in an arc melting furnace at an input current of 30 A/g to produce an ingot, and subsequently the ingot was melted again in a liquid quenching apparatus and then quenched to be processed into fine wires. Those fine wires were pulverized with an agate mortar to obtain a powder. The powder was passed through a 300 μm-mesh sieve and then was used as a hot press raw material. The hot press conditions were set to a calcination temperature of 1200° C. and a pressing pressure of 3.5 ton, and for the other conditions, the experiment was carried out under conditions similar to those of Example 6.

Example 14

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=60 atm % and Ru/(Ru+Si)=40 atm %, the mixture was melted in an arc melting furnace at an input current of 30 A/g to produce an ingot, and then the ingot was pulverized with an agate mortar to obtain a powder. A metal ruthenium powder was added to the powder such that Si/(Ru+Si)=50 atm % and Ru/(Ru+Si)=50 atm % in total, and subsequently the mixture was passed through a 300 μm-mesh sieve and then was used as a hot press raw material. The hot press conditions were set to a calcination temperature of 1750° C. and a pressing pressure of 3.5 ton, and for the other conditions, the experiment was carried out under conditions similar to those of Example 6.

TABLE 3

| | Composition | | Average | Area-weighted | Space group of | | Electrical | Seebeck | Power | Thermal conductivity | |
|---|---|---|---|---|---|---|---|---|---|---|---|
| | Si/ | Ru/ | crystal | average | observed | Phase 1/ | | | | (W/K · m) | |
| | (Si + Ru) at % | (Si + Ru) at % | grain size (m) | crystal grain size (m) | crystal phase | (phase 1 + phase 2) | resistance (Ω · cm) | Seebeck (μV/K) | factor (W/mK²) | Room temperature | 100° C. |
| Example 11 | 50 | 50 | 1.00E−05 | 2.30E−05 | 198, 221 | 0.018 | 3.70E−03 | 381 | 3.92E−03 | 11.7 | 9.5 |
| Example 12 | 50 | 50 | 2.90E−05 | 6.00E−05 | 198, 221 | 0.046 | 7.60E−03 | 377 | 1.87E−03 | 12.8 | 10.7 |
| Example 13 | 50 | 50 | 9.00E−06 | 1.40E−05 | 198, 221 | 0.003 | 9.80E−03 | 338 | 1.17E−03 | 8.7 | 7.2 |
| Example 14 | 50 | 50 | 1.90E−05 | 4.30E−05 | 198, 221 | 0.1 | 5.00E−04 | 135 | 3.65E−03 | 26.0 | 24.0 |

Example 15

A sample obtained by mixing a silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) such that Si/(Ru+Si)=50 atm % and Ru/(Ru+Si)=50 atm %, was brought to a molten state by high-frequency heating, and the entire amount was dropped onto a cooled oxygen-free copper roll to produce a quenched ribbon (cooling rate $8×10^5$ K/s). The speed of rotation of the copper roll at this time was set to about 3000 rpm. The quenched ribbon obtained here was pulverized in an agate mortar, and the resultant was passed through a 300 μm-mesh sieve and then was used as a raw material for spark plasma sintering. Sintering was performed using a carbon mold having a size of 2 cm ϕ, and in a spark plasma sintering apparatus, the raw material was heated to 1000° C. at a rate of temperature increase of 50° C./min and then was heated to 1400° C. at a rate of 20° C./min. After the material was maintained at 1400° C. for 10 minutes, the material was subjected to natural cooling. The pressure at the time of sintering was set to 2.4 ton, and the degree of vacuum was 5.0e-3 Pa. The methods for evaluating the physical properties were carried out by setting the evaluation temperature to 100° C., and for the other conditions, the methods were carried out in the same manner as in Example 1. The results are presented in Table 4.

Example 16

An experiment was carried out under conditions similar to those of Example 15 except that the pressure for spark plasma sintering was set to 1.6 ton. The results are presented in Table 4.

Example 17

An experiment was carried out under conditions similar to those of Example 15 except that the pressure for spark plasma sintering was set to 2.4 ton, and the retention temperature during sintering was set to 1300° C. The results are presented in Table 4.

Example 18

A silicon powder (purity 4 N, average particle size 300 μm, manufactured by Kojundo Chemical Laboratory Co., Ltd.) and metal ruthenium (purity 99.9%, average particle size 150 μm, manufactured by Furuuchi Chemical Corp.) were mixed such that Si/(Ru+Si)=50 atm % and Ru/(Ru+Si)=50 atm %, the mixture was melted in an arc melting furnace at an input current of 30 A/g to produce an ingot, and then the ingot was pulverized with an agate mortar to obtain a powder. The powder was passed through a 300 μm-mesh sieve and then was used as a hot press raw material. The hot press conditions were set to a calcination temperature of 1750° C. and a pressing pressure of 3.5 ton, the retention time was set to 10 minutes, and for the other conditions, the experiment was carried out under conditions similar to those of Example 6. The results are presented in Table 4.

TABLE 4

| | Composition | | Average crystal grain size (m) | Area-weighted average crystal grain size (m) | Space group of observed crystal phase | Phase 1/ (phase 1 + phase 2) | Electrical resistance (Ω · cm) | Seebeck (μV/K) | Power factor (W/mK²) | Thermal conductivity (W/K · m) | |
|---|---|---|---|---|---|---|---|---|---|---|---|
| | Si/ (Si + Ru) at % | Ru/ (Si + Ru) at % | | | | | | | | Room temperature | 100° C. |
| Example 15 | 50 | 50 | 2.00E−06 | 1.00E−05 | 198, 221 | 0.004 | 2.20E−03 | 362 | 5.96E−03 | 11.3 | 8.0 |
| Example 16 | 50 | 50 | 1.50E−06 | 9.00E−06 | 198, 221 | 0.003 | 2.30E−03 | 343 | 5.12E−03 | 11.1 | 8.2 |
| Example 17 | 50 | 50 | 1.10E+06 | 5.00E−06 | 198, 221 | 0.01 | 2.10E−03 | 340 | 5.50E−03 | 10.1 | 6.9 |
| Example 18 | 50 | 50 | 7.00E+06 | 2.50E−05 | 198, 221 | 0.02 | 3.40E−03 | 388 | 4.43E−03 | 11.0 | 9.6 |

The results of Examples 6 to 18 thus obtained showed values higher than the thermoelectric conversion performance described in Non Patent Literatures 3 and 4 even for a temperature range of 200° C. or lower. From this, high thermoelectric conversion performance can be achieved by the present invention, even for a temperature range of 200° C. or lower.

Comparative Example 1

An alloy was obtained by a technique similar to Example 1, except that the raw materials were adjusted such that Si/(Ru+Si)=99 atm % and Ru/(Ru+Si)=1 atm %.

Comparative Example 2

An alloy was obtained by a method similar to Example 1, except that a silicon powder was used as a raw material such that Si/(Ru+Si)=100 atm %, and the calcination temperature during hot pressing was set to 1200° C.

Comparative Example 3

An alloy was obtained by a method similar to Example 1, except that a silicon powder was used as a raw material such that Si/(Ru+Si)=75 atm % and Ru/(Ru+Si)=25 atm %, and the calcination temperature during hot pressing was set to 1400° C.

Comparative Example 4

An alloy was obtained by a method similar to Example 1, except that a silicon powder was used as a raw material such that Si/(Ru+Si)=41 atm % and Ru/(Ru+Si)=59 atm %, and the calcination temperature during hot pressing was set to 1400° C.

TABLE 5

| | Composition | | Average | Area-weighted | Space group of | | | | Thermal conductivity | |
| | Si/ | Ru/ | crystal | average | observed | Electrical | Seebeck | Power | (W/K · m) | |
| | (Si + Ru) at % | (Si + Ru) at % | grain size (m) | crystal grain size (m) | crystal phase | resistance ($\Omega \cdot cm$) | coefficient ($\mu V/K$) | factor ($W/mK^2$) | Room temperature | 600° C. |
|---|---|---|---|---|---|---|---|---|---|---|
| Comparative Example 1 | 99 | 1 | 1.10E−05 | 5.50E−05 | 227 | 4.90E−02 | 348 | 2.47E−04 | 57 | 21 |
| Comparative Example 2 | 100 | 0 | 1.10E−05 | 3.60E−05 | 227 | 6.30E−02 | 401 | 2.55E−04 | 123 | 40 |
| Comparative Example 3 | 75 | 25 | 6.00E−06 | 4.20E−05 | 225 | 7.80E−03 | 57 | 4.17E−05 | 78 | 61 |
| Comparative Example 4 | 41 | 59 | 8.00E−06 | 5.40E−05 | 62 | 5.40E−03 | 42 | 3.27E−05 | 89 | 69 |

Comparative Example 5

An alloy was obtained by a technique similar to Example 6, except that the raw materials were mixed such that Si/(Ru+Si)=99 atm % and Ru/(Ru+Si)=1 atm %.

Comparative Example 6

An alloy was obtained by a method similar to Example 6, except that a silicon powder was used as a raw material such that Si/(Ru+Si)=100 atm %, and the temperature during hot pressing was set to 1200° C.

Comparative Example 7

An alloy was obtained by a method similar to Example 6, except that the raw materials were mixed such that Si/(Ru+Si)=75 atm % and Ru/(Ru+Si)=25 atm %, and the temperature during hot pressing was set to 1400° C.

Comparative Example 8

An alloy was obtained by a method similar to Example 6, except that the raw materials were mixed such that Si/(Ru+Si)=41 atm % and Ru/(Ru+Si)=59 atm %, and the calcination temperature during hot pressing was set to 1400° C.

In Comparative Examples 1 to 8, which are not included in the scope of the present invention, the thermoelectric conversion performance was inferior to that of the present invention, under the conditions of both 200° C. or lower and 600° C.

INDUSTRIAL APPLICABILITY

By using the present invention, a thermoelectric conversion device having high performance can be produced, and exhaust heat in a wide temperature range can be efficiently utilized.

The present invention has been described in detail with reference to specific embodiments; however, it should be apparent to those ordinarily skilled in the art that various modifications and corrections can be made without departing from the spirit and scope of the present invention.

The present application is based on a Japanese patent application filed on Jan. 18, 2019 (Japanese Patent Application No. 2019-006659), a Japanese patent application filed on Mar. 7, 2019 (Japanese Patent Application No. 2019-041217), a Japanese patent application filed on Aug. 8, 2019 (Japanese Patent Application No. 2019-146704), and a Japanese patent application filed on Dec. 17, 2019 (Japanese Patent Application No. 2019-227426), the entire disclosures

TABLE 6

| | Composition | | Average | Area-weighted | Space group of | | | | | Thermal conductivity | |
| | Si/ | Ru/ | crystal | average | observed | Phase 1/ | Electrical | Seebeck | Power | (W/K · m) | |
| | (Si + Ru) at % | (Si + Ru) at % | grain size (m) | crystal grain size (m) | crystal phase | (phase 1 + phase 2) | resistance ($\Omega \cdot cm$) | coefficient ($\mu V/K$) | factor ($W/mK^2$) | Room temperature | 600° C. |
|---|---|---|---|---|---|---|---|---|---|---|---|
| Comparative Example 5 | 99 | 1 | 1.10E−05 | 5.50E−05 | 227 | — | 4.90E−02 | 348 | 2.47E−04 | 57 | 21 |
| Comparative Example 6 | 100 | 0 | 1.10E−05 | 3.60E−05 | 227 | — | 6.30E−02 | 401 | 2.55E−04 | 123 | 40 |
| Comparative Example 7 | 75 | 25 | 6.00E−06 | 4.20E−05 | 225 | — | 7.80E−03 | 57 | 4.17E−05 | 78 | 61 |
| Comparative Example 8 | 41 | 59 | 8.00E−06 | 5.40E−05 | 62 | — | 5.40E−03 | 42 | 3.27E−05 | 89 | 69 |

The invention claimed is:

1. A silicide-based alloy material comprising silicon and ruthenium as main components,
wherein when contents of silicon and ruthenium are denoted by Si and Ru, respectively, an atomic ratio of devices constituting the alloy material satisfies the following:

45 atm %≤Si/(Ru+Si)≤70 atm %

30 atm %≤Ru/(Ru+Si)≤55 atm %, and wherein an average crystal grain size of the silicide-based alloy material is 50 μm or less.

2. The silicide-based alloy material according to claim 1, wherein the average crystal grain size of the silicide-based alloy material is from 1 nm to 20 μm.

3. The silicide-based alloy material according to claim 2, wherein the average crystal grain size of the silicide-based alloy material is from 3 nm to 1 μm.

4. The silicide-based alloy material according to claim 3, wherein the average crystal grain size of the silicide-based alloy material is from 5 nm to 500 nm.

5. The silicide-based alloy material according to claim 1, wherein the silicide-based alloy material has a plurality of crystal phases in a texture.

6. The silicide-based alloy material according to claim 1, wherein the contents of silicon and ruthenium satisfy the following:

55 atm %≤Si/(Ru+Si)≤65 atm %

35 atm %≤Ru/(Ru+Si)≤45 atm %.

7. The silicide-based alloy material according to claim 1, wherein the silicide-based alloy material has at least two types of crystal phases selected from the croup consisting of space groups 198, 64, and 60 in the texture.

8. The silicide-based alloy material according to claim 1, wherein the contents of silicon and ruthenium satisfy the following:

47 atm %≤Si/(Ru+Si)≤60 atm %

40 atm %≤Ru/(Ru+Si)≤53 atm %.

9. The silicide-based alloy material according to claim 1, wherein the silicide-based alloy material has crystal phases having space groups 221 and 198 in a texture.

10. A thermoelectric conversion device, comprising:
the silicide-based alloy material of claim 1.

* * * * *